United States Patent [19]

Lamiraux

[11] Patent Number: 4,695,843
[45] Date of Patent: Sep. 22, 1987

[54] METHOD FOR PROCESSING RADIO SIGNALS FOR RADIONAVIGATION AND RECEIVER FOR CARRYING OUT THE SAID METHOD

[75] Inventor: Christian Lamiraux, Saint Sebastien Sur Loire, France

[73] Assignee: MLR Electronic, France

[21] Appl. No.: 614,769

[22] Filed: May 29, 1984

[30] Foreign Application Priority Data

May 30, 1983 [FR] France .................................. 8308916
Apr. 26, 1984 [FR] France .................................. 8406597

[51] Int. Cl.$^4$ .............................................. G01S 5/08
[52] U.S. Cl. ................................................. 342/417
[58] Field of Search ............... 343/394, 395, 393, 396, 343/397; 342/193, 189, 417; 370/121; 364/452

[56] References Cited

U.S. PATENT DOCUMENTS 3,936,763  2/1976  Palmer ............................. 343/396 X
4,015,262  3/1977  Etcheverry et al. ............ 343/105 R
4,138,680  2/1979  Delorme et al. ................. 343/105 R

FOREIGN PATENT DOCUMENTS 0059138  9/1982  European Pat. Off. .
0079280  5/1983  European Pat. Off. .

OTHER PUBLICATIONS

"Sampling Network Analyzer for Periodic Functions", Wescon Conference Record, vol. 25, 9/81, pp. 1-7.
"Phasemeter Large Bande a Detection . . . ", L'Onde Electrique, vol. 55, No. 6, Jun., 1985, pp. 341-346.
"Les Radionavigateurs RANA", L'Onde Elecrique, vol. 33, No. 314, May, 1953, pp. 319-327.

Primary Examiner—Theodore M. Blum
Assistant Examiner—Mack Hellner
Attorney, Agent, or Firm—Steinberg & Raskin

[57] ABSTRACT

The present invention relates to a method and a receiver for radionavigation, said receiver comprising a single filter mounted downstream of a mixer and adapted to allow the passage of the composite signal formed by the superposition of the signals of lower frequency at the output of the mixer, a sampler intended to sample the composite signal filtered at a predetermined frequency ($f_e$), a unit intended to produce by a frequency analysis operation a series of signals including the same frequency components as the composite signal and means adapted to establish the phases and, if appropriate, the amplitude of the signals produced in the receiver by correlating these signals with the samples obtained from the sampler.

17 Claims, 3 Drawing Figures

METHOD FOR PROCESSING RADIO SIGNALS FOR RADIONAVIGATION AND RECEIVER FOR CARRYING OUT THE SAID METHOD

BACKGROUND OF THE INVENTION

The present invention relates to a method for processing a series of signals, particularly radio signals exhibiting a same interval of a low frequency between adjacent signals, especially radiofrequency signals, of a radionavigation system such as the RANA system, to allow, by using the phases of the signals received, the location of a receiver set, and a receiver for carrying out the said method.

The conventional methods consist in converting the radiofrequency signals into signals exhibiting a lower frequency, by means of mixer means, in separating the various signals of lower frequency in filters so tuned as to obtain at the output of each of the filters a signal isolated from the adjacent signals. These known methods suffer from the major drawback that the filters must display sharp selectivity characteristics because of the proximity of the frequencies to be separated. The phase shift inherent in the filtering may result in random errors in the phase-shift measurements which follow. This technique must therefore generally be completed by so-called self-testing measurements for which it is necessary to locally generate standard signals which are momentarily substituted for the reception signals. Furthermore, it is observed that these known methods require the use of as many filters as there are signals to be processed, since, as is well known, at least three filters are necessary to make two phase difference measurements. There results therefrom a complex and costly structure of the receivers.

SUMMARY OF THE INVENTION

The present invention has for a purpose to provide a method and a receiver which do not suffer from the above-mentioned drawbacks inherent in the known methods and receivers.

To achieve this purpose, the method of the invention is characterized in that the radio signals received are converted into a series of signals of lower frequency, each of which constitutes a harmonic or a multiple of the interval frequency between two adjacent radio signals, the composite signal formed by the superposition of the signals of lower frequency is sampled, and there is locally produced a series of signals of lower frequency, which include the same components as the series which has been sampled, and the values of the local signals are determined by correlation with the samples.

According to an advantageous feature of the invention, the series is produced locally by programmed analysis by means of a processing unit such as a computer or a microprocessor.

According to another advantageous feature, there is predetermined by estimation for each signal received a phase which is checked and adapted by taking into account the values of the samples so as to cause the estimated phase to follow up the corresponding signal received, this follow-up estimated phase being directly usable for radiolocation.

The receiver for carrying out the method of the present invention is characterized in that it includes a system of acquisition and processing of the signals received, having at least one filtre mounted downstream of the mixer and adapted to allow the passage of the composite signal formed by the superposition of signals of lower frequency at the output of the mixer, and a sampler for sampling the composite signal filtered at a predetermined frequency; a logic system adapted to produce by an operation of frequency analysis a series of signals including the same frequency components as the composite signal and to establish the phases and, if appropriate, the amplitudes of the signals produced in the receiver by correlating these signals with the samples obtained by the sampler.

According to another feature of the invention, the logic system includes at least one processing unit such as a computer or a microprocessor adapted to ensure the co-operation and the synchronous operation of the devices constituting the system of acquisition and processing and the logic system.

According to another advantageous feature of the invention, the acquisition and processing system includes a series circuit of amplifying means and mixing means, the amplifying means including a high frequency amplifier tuned under the action of an automatic frequency-control voltage furnished by the logic system and the mixing means being controlled by signals produced by the logic system.

According to another advantageous feature of the invention, the receiver includes a master or pilot oscillator of nominal frequency which includes means such as a potentiometer allowing a coarse control by adjusting the central frequency and means adapted to ensure a fine control of the frequency by a control signal from the logic system, the pilot or control signal of the oscillator being transmitted to the logic system.

According to another advantageous feature of the invention, the processing or computing unit of the logic system includes an internal frequency dividercounter adapted to produce from the said pilot signal an output signal allowing the production by frequency division of the reference signals necessary for the clocking of the operations performed by the acquisition and processing system.

According to still another advantageous feature of the invention, the processing or computing unit is connected by a bidirectional data bus to an analog-to-digital converter intended to transmit to the processing unit the measurements of the phases and of the amplitude of the reception signals and to a circuit adapted to transfer the programmed frequency-reception data and for the control of the automatic gain-control voltages intended for the amplifying means of the system of acquisition and follow-up of the master or pilot oscillator, as well as for the reception of interruption signals intended to clock the programme of the receiver.

According to still another feature, the transfer and control circuit is connected by a bus to a programmable counter of which it controls the frequency division rate in such a manner as to produce the frequency necessary for subsequently aligning the receiver on the various frequencies of the radionavigation on system.

BRIEF DESCRIPTION OF THE DRAWINGS

The invention will be better understood and other purposes, features, details and advantages thereof will appear more clearly as the following explanatory description proceeds with reference to the appended diagrammatic drawings given solely by way of example illustrating one form of embodiment of the invention and wherein.

DESCRIPTION OF THE PREFERRED EMBODIMENTS

The present invention will be described by way of example in its application to a radionavigation system of the RANA type.

A signal receiver of the RANA type must process phase signals received on a series of sequential frequencies and another series of frequencies referred to as "permanent frequencies". Within the scope of the present invention, only the permanent frequencies are processed. A RANA network may contain 18 transmitter stations. Each station, designated by a number N equal to 1 to 9 or 11 to 19 transmits a permanent frequency F. Two adjacent frequencies of the series of signals transmitted are separated by a low frequency $\Delta f$.

Figure 1:
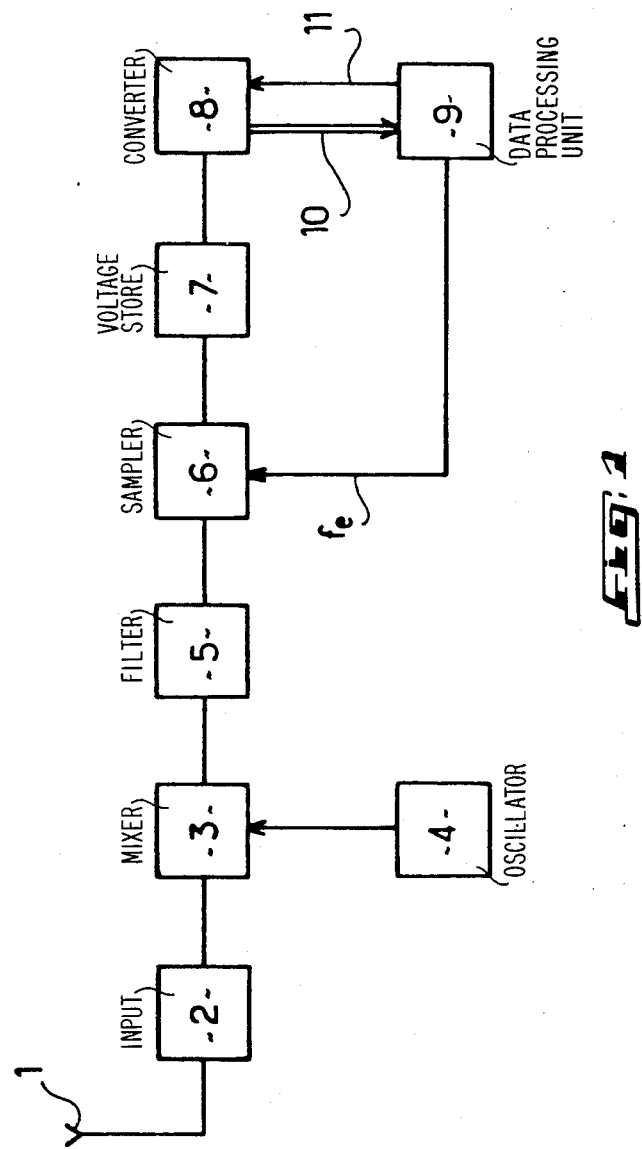
FIG. 1 illustrates in the form of a block diagram the principle of a receiver according to the present invention.

FIG. 1 shows in the form of a block diagram a receiver intended for the processing of the signals according to the present invention. The series of the RANA signals is picked up by the antenna 1 and, after being processed in an input device 2, reaches a mixer 3 connected to a local master or pilot oscillator 4. This mixer converts the series of radio signals received into a series of signals of lower frequency. The mixer is followed by a single filtre 5 with a relatively narrow passband. At the output of the filtre there appears a composite signal formed by the superposition of the lowfrequency signals obtained by the mixer. The composite signal is applied to a sampler 6 to which are applied sampling pulses of a predetermined frequency $f_e$. The sampler is followed by an operational amplifier 7 mounted as a voltage storing device, and by an analog-to-digital converter 8. The latter co-operates with the data processing unit 9 consisting advantageously of a microprocessor. The converter furnishes to the microprocessor, through a bus 10, the values of the voltages sampled in digital form. The conversion commands supplied by the microprocessor through a connection designated by the reference numeral 11 is synchronous with the sampling pulse of $f_e$ frequency. The microprocessor is programmed to produce by a frequency analysis operation a series of signals including the same frequency components as the composite signal at the output of the filtre 5 and establishes the phases and the amplitudes of the signals thus produced in the receiver by correlating these signals with the samples produced by the sampler 8, for the purpose of determining data allowing the position of the receiver with respect to the transmitter stations of the RANA system to be identified.

The principle inherent in the present invention lies in the fact that the radio signals of high frequency received are converted into signals of lower frequency of such value that the frequencies thus obtained constitute multiples or harmonics of the frequency $\Delta f$ separating two radio signals received by the antenna or aerial 1. It is sufficient, to this end, to appropriately select the frequency of the master oscillator 4 and to also take into account the fact that the sampler 6 followed by the voltage store 7 has the same effect as a mixer and therefore performs an additional transposition of the frequencies, to which is subjected the composite signal at the output of filtre 5. According to the invention, this is done in such a manner that the low frequency signals F' after the transposition comply with the following relation:

$$F' = \Delta f \times (N + N_0)$$

In this relation, $N_0$ constitutes a whole number and determines the lowest multiple which it is desired to process. This relation between the frequencies to be processed allows recreating by means of the microprocessor 9 a series of signals including the same frequency components as the signal complying with the aforementioned relation, and determining the characteristics of these components by correlating them with the samples furnished by the sampler 8. To this end, the microprocessor performs a frequency analysis based on a development in the Fourier series.

To facilitate the description of the invention, it is desirable, before describing the various operations to be performed by the microprocessor, to indicate the characteristic values of the RANA system and of a form of embodiment of the receiver according to the present invention. Of course, the invention may be adapted to suit other systems while at the same time complying with the principle of the invention.

Each RANA station transmits a permanent frequency which may be expressed by applying the principle on which the invention is based, in the following manner:

$$F = 285.5 \text{ kHz} + (N+6) 6.25 \text{ Hz}.$$

In this relation, N is the number of the transmitting station considered, the value of 6.25 Hz constitutes the low frequency $\Delta f$ separating two adjacent RANA signals transmitted, whereas $N_0$ is constituted here by the number 6.

The master oscillator 4 produces a frequency of 285 kHz, the single filtre 5 has a central frequency of 500 Hz and a passband of 430 to 570 Hz. The sampling frequency $f_e$ is 400 Hz. Two sampling pulses are therefore spaced from one another by 2.5 milliseconds. Taking into account these values and the additional frequency transposition effect produced by the sampler 6 and the voltage storage 7, the signal seen by the converter 8 is 100 Hz, which is the difference between the input frequency of 500 Hz and the sampling frequency of 400 Hz.

The principle of the processing performed by the microprocessor 9 is based on the consideration that the components of the composite signal, to the extent that the latter constitutes a periodical function with a period of 1/6.25 Hz = 160 milliseconds may be isolated by computing. Since all the components are multiples of the frequency $\Delta f = 6.25$ Hz, the composite signal F't, in view of its periodic character, can be expressed in the form of the following trigonometric series (disregarding the component $a_0$):

$$F(t) = \sum_{n=0}^{\infty} (a_n \cos n \, \omega t + b_n \sin n \, \omega t) \quad (1)$$

$\omega$ being the fundamental frequency $2\pi \times \Delta f = 2\pi \times 6.25$ Hz; an, bn constituting the amplitude coefficients and n being an integral number designating the order of the harmonic of the coefficients an and bn From the coefficients an, bn, there can be determined the amplitude of a harmonic signal of the order n according to the expression $[a_n^2+b_n^2]^{\frac{1}{2}}$ and the angle formed by these coefficients according to the expression $\zeta n = \text{Arctg } b_n/a_n$.

The coefficients an and bn are obtained according to a Fourier development according to the following relations:

$$an = 2 \int_0^T F(t) \cos 2\pi n \frac{t}{T} dt \quad (2)$$

$$bn = 2 \int_0^T F(t) \sin 2\pi n \frac{t}{T} dt$$

T constituting the fundamental period of 160 milliseconds = 1/6.25.

To allow the computing by the microprocessor, the integrals are replaced by finite sums. In the present example, it is desired to performed 64 sums spaced by 2.5 milliseconds and the following expressions are obtained:

$$an = \sum_{t=0}^{63} F(t) \cos \left( 2\pi n \frac{t \times 2.5 \ 10^{-3}}{160 \ 10^{-3}} \right) \quad (3)$$

$$bn = \sum_{t=0}^{63} F(t) \sin \left( 2\pi n \frac{t \times 1.5 \ 10^{-3}}{160 \ 10^{-3}} \right)$$

The constant coefficients are removed since only the relative values of the signals are interesting.

The angles are expressed here in radians. It is suitable, in the system of computing by the microprocessor, to express them in 256th of a turn. To this end, the angle is divided by $2\pi$ and multiplied by 256. The following relations are obtained:

$$an = \sum_{t=0}^{63} F(t) \cos (4 \ nt) \quad (4)$$

$$bn = \sum_{t=0}^{63} F(t) \sin (4 \ nt)$$

By choosing $N_0=6$, the number n can be expressed by $N+6$ and there is obtained:

$$an = \sum_{t=0}^{63} F(t) \cos 4t \ (N + 6) \quad (5)$$

$$bn = \sum_{t=0}^{63} F(t) \sin 4t \ (N + 6)$$

Within the scope of the invention the composite signal F'(t) assumes successively the values $F_e'$ of the samples produced by the sampler 6.

According to the invention, it is sought to cancel the angle $\zeta$, that is to say, bn. To this end, the following is laid down:

$$an = \sum_{t=0}^{63} F_e(t) \cos (4t \ (N + 6) + PE_n) \quad (6)$$

$$bn = \sum_{t=0}^{63} F_e(t) \sin (4t \ (N + 6) + PE_n)$$

In these relations, the term $PE_n$ constitutes a constant initial phase value. This is the phase of the radio signal corresponding to the low frequency of the same order as the harmonic n with respect to the local frequency produced in the receiver, i.e. the sampling signal $f_e$.

According to the invention, there is predetermined, for a frequency to be processed bearing the number N, a phase $PE_n$ which is therefore an estimated phase quantified in fractions of a turn and the function of the processing is to compare this estimated phase with the phase received in order to correct, if appropriate, the estimated phase according to a follow-up principle. As pointed out above, it is sought to cancel the angle $\zeta$, i.e. the amplitude coefficient bn indicated by the aforementioned relations.

On the basis of the estimated phase $PE_n$, the microprocessor determines the actual phase by correlating successively the computer amplitude coefficients an, bn with the samples furnished by the converter 8. Otherwise stated, there is performed according to the present invention a programmed analysis by the microprocessor so as to obtain for any frequency an indication of phase shift varying as the sinus of this shift, so as to cause a programmed estimated phase to follow-up a received phase identified in the group by the number of the corresponding transmitting station.

It should be noted that the phase $PE_n$ finally established by the microprocessor is usable directly for radio location. This is the phase of the signal of frequency n at the instant marked by $t=0$ by the microprocessor. Thereafter, use is made only of phase differences taken with respect to a same time of origin to define the propagation time differences between the transmitters and the receiver.

In the specific form of embodiment of a receiver according to the present invention, six distinct frequencies selected among the possible 18 RANA frequencies are processed simultaneously. In this form of embodiment, the time is cut up into segments of 240 milliseconds = 96 periods of time of 2.5 milliseconds. The sampling operations and the take-offs from the converter are performed during the last 160 milliseconds from $t=32$ to $t=95$ inclusively.

At the outset, when $t=31$, the summing means sin and cos are set to 0, i.e. means which perform the accumulations according to expressions 6. At this time $t=31$ the amplitude coefficients an, bn have a phase value which is equal to $PE_n$, i.e. to the estimated value.

At the time $t:32$, corresponding to 1 in the formula, it should be taken into account that the angle has changed by a value equal to $4(N+6)$. Thus, the total phase or time $t=32$ has the value $PE_n+4 \ (N+6)$. The sinus of the angle defined by the expression is also calculated and then multiplied by the value which has just been taken off from the converter. This result is added to the value obtained at the instant $t=31$. The same is performed for the cosinus.

At the time $t=33$ (2 of the formula), there is again added to the total value the value $4 \ (N+6)$ and the cumulation is also made for the sinus and the cosinus. The same operations are performed for each of the frequencies.

Thus, there is performed for each frequency, starting from the estimated phase, the phase variation according to $4 \ (N+6)$ from one sample to the other, the phase, sinus and cosinus are totalled, the averaged amplitude is established as well as the average of the absolute values of the deviation of the measured phase with respect to the estimated phase PE. The various totallings are interpreted every 240 milliseconds at t=5. The totallings of the sinus serve mainly to correct the value PE. The instantaneous amplitude is calculated according to $[(\text{TOTAL SIN})^2 + (\text{TOTAL COS})^2]^{\frac{1}{2}}$ and serves to correct the average of the instantaneous value. This allows eliminating the interference, i.e. the radio noise and provides information as to the exactness of the amplitudes.

Moreover, the TOTAL SIN is cumulated in a register for the frequencies. The result serves to correct the master oscillator 4 which controls the accuracy of the frequency transposition in the passband of filtre 5.

Figure 2:
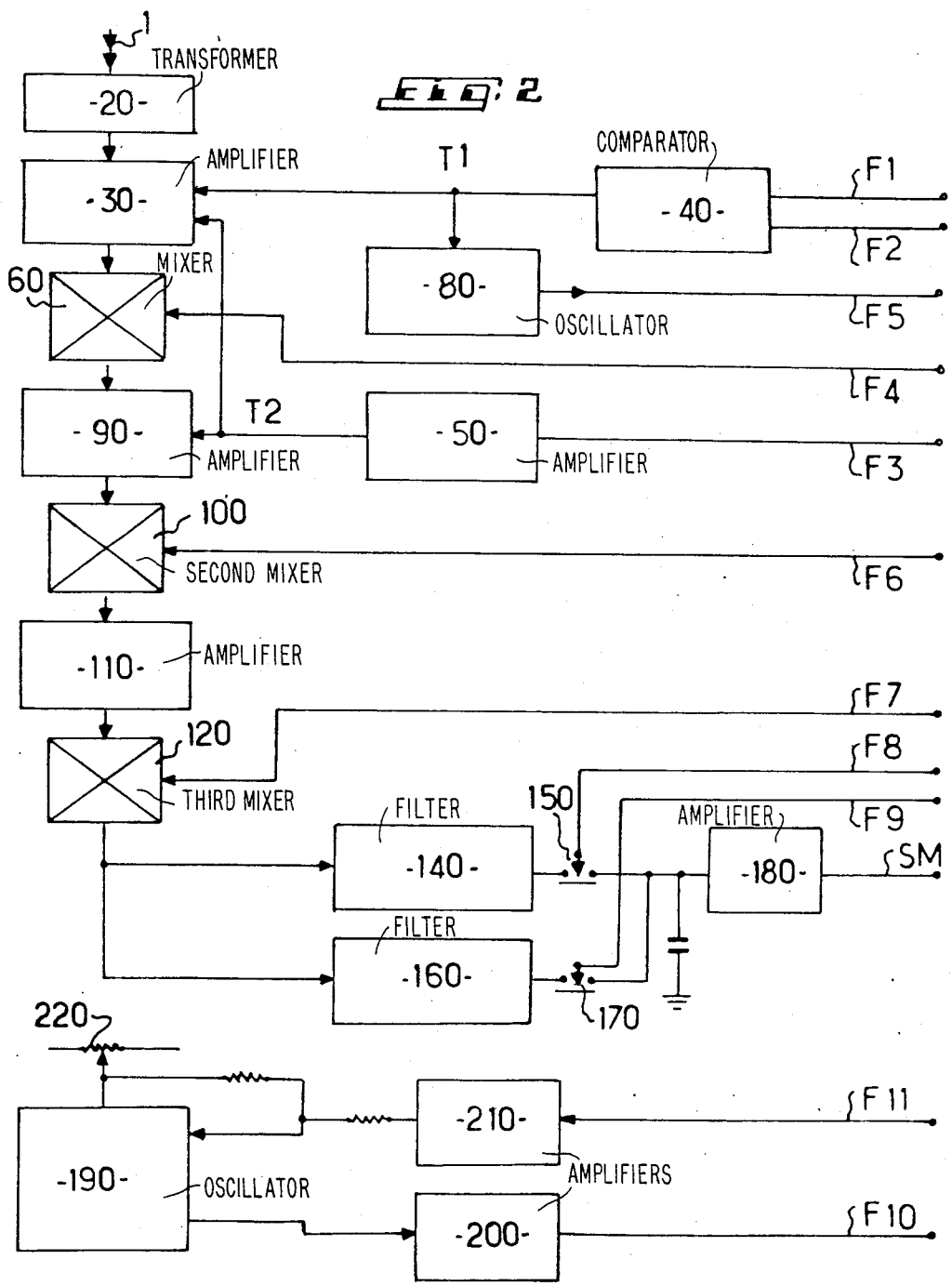
FIG. 2 shows the block diagram of an acquisition and processing system of the present invention.

Referring now to FIG. 2, there will first be described the system of acquisition and processing of the radio signals of a radio navigation system such as the system referred to as RANA and transmitting frequencies in the range of from 285 to 420 kilohertz. Of course, these values are given only by way of example without the receiver of the invention being limited to such values. The system includes at least the filtre and sampler shown in FIG. 1.

For an easier understanding of the description, there will be given hereafter the specific frequency values of the various components of the receiver.

As appears from FIG. 2, the signals received by the antenna or aerial 1 are transmitted by an isolating transformer 20 to a high frequency amplifier 30 capable of being tuned to frequencies between 280 and 420 kilohertz under the action of an automatic control voltage of T1 frequency obtained from a reference signal of 2 kilohertz F1 and a control signal of 2 kilohertz F2 furnished by the logic system, through the medium of a phase and frequency comparator 40. The gain of the amplifier 30 is adjustable by an automatic gain-control or voltage T2 which is produced by an integrating amplifier 50 from a logic signal F3 supplied by the logic system. A first mixer 60 is arranged downstream of the high frequency amplifier 30. It is intended to transpose the signal it receives to a frequency of 50.6 kilohertz. This mixer is controlled by a signal F4 produced by dividing by 10 the frequency F5 supplied by local oscillator 80 under the action of the automatic frequency-control voltage T1. The output signal of 59.6 kilohertz of the mixer 60 is transmitted by a medium frequency amplifier 90, which is also controlled by the automatic gain-control voltage T2, to a second mixer 100 adapted to transpose the signal received to a frequency of 4.5 kilohertz. This mixer is controlled by a signal F6 of 64 kilohertz from the logic system. A medium frequency amplifier 110 transmits the output signal of the mixer 100 to a third mixer 120 controlled by a logic signal F7 of 4 kilohertz proceeding from the logic system. A narrow passband filtre 140, corresponding to the filtre 5 of FIG. 1 and tuned to 400 hertz, transmits the sequential signal of the RANA system to a sampler 150 corresponding to the sampler 6. A filtre 160 with a wide band of 440 to 560 hertz transmits the low output frequencies of the mixer 120, obtained from the permanent frequencies of the RANA system, to a sampler 170. Both samplers 150 and 170 are controlled by pulses F8 ($=f_e$) of 500 hertz and F9 of 400 hertz, supplied by the logic system. The samplers furnish alternately to the logic system, through an amplifier 180 corresponding to the amplifier 7, the measurement signals SM obtained by the transposition and sampling processing to which the radio signals received by the antenna 1 have been subjected.

FIG. 2 also shows that the receiver according to the addition includes a master or pilot oscillator 190 of nominal frequency, e.g. 4,096 kilohertz, which is intended to supply to the logic system the pilot or clock signal F10 after its amplification by an amplifier 200. With the oscillator 190 is associated an adjusting device including a potentiometer 220 which allows adjusting the central frequency of the oscillator. This potentiometer constitutes a coarse adjusting means. The central frequency is more finely adjusted by a control signal F11 supplied by the logic system. This signal is amplified by a control amplifier 210 fulfilling the function of an integrator and transmitted to the oscillator 190 and to the potentiometer 220. The output resistor adjusts the range of action of the control signal on the pilot frequency to about + or −6 hertz.

Figure 3:
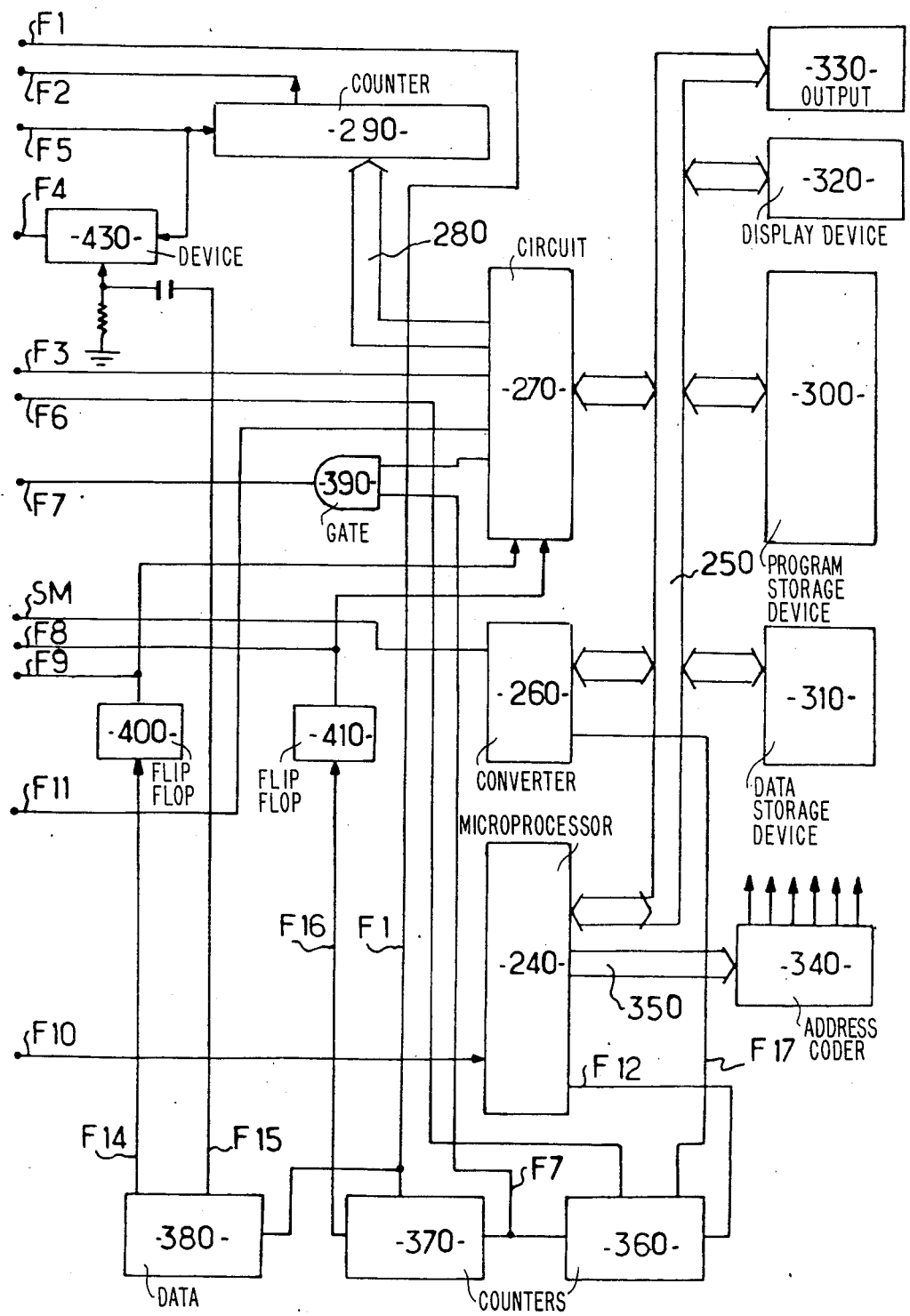
FIG. 3 illustrates in the form of a block diagram the logic system of a receiver according to the invention.

There will now be described the logic system, including at least the processing unit of FIG. 1, by referring to FIG. 3 which shows the block diagram of this logic system. In the left portion are seen all the operating signals intended to be transmitted to the system of acquisition and processing represented in FIG. 2 and the signals proceeding from the acquisition system and intended for the logic system.

This system includes a microprocessor 240, corresponding to the aforesaid unit, which is connected by a bidirectional data bus 250 to an analog-to-digital converter 260, corresponding to the converter 8, from which it receives the signals of measurement SM of the phases and of the amplitude of the reception signals, and to a programmable counter 290, and for generating the automatic gain-control voltage F3 and the control signal F11 for the pilot oscillator 190.

The microprocessor 240 is also connected by the bus 250 to a program storage device 300, to a data storage device 310 of the RAM type, to a keyboard and display device 320 and a digital output device 330. The circuits 260, 270, 300 to 330 are usually addressable through the medium of an address coder 340 connected by a bus 350 to the microprocessor 240.

The microprocessor 240 includes an internal frequency-dividing counter which is adapted to produce a signal F12, the frequency of which, in the receiver considered here by way of example, is 1,024 kilohertz. The signal F12 is applied to a series of 3 dividing counters, 360, 370, 380 intended to effect a division by 256, 8 and 10, respectively, to provide the reference signals necessary for the clocking or timing of the acquisition and filtering operations to be performed by the system according to FIG. 2. Thus, the counter dividing by 256, designated by the reference numeral 360, produces at its output the signal F7 of 4 kilohertz which is applied through a gate 390 to the mixer 120. The dividing counter 370 which effects a division by 8 produces the reference signal F1 of 2 kilohertz which will be applied to the comparator 40 intended to produce the automatic frequency-control voltage for the high frequency amplifier 30. This signal F1 is also transmitted to the divider 380 which produces two signals F14 and F15 of 400 hertz and 200 hertz, respectively. The dividing counter 370 generates also a signal F16 of 500 hertz. The signals F14 and F16 each reach a flip-flop 400, 410 intended to produce the sampling pulses F9 and F8, respectively, for the samplers 150, 160 of the acquisition and processing systems. The signals F8 and F9 also constitute the interrupting signals intended to clock the program of the receiver and are applied to this end to the circuit 270. The signal F15 of 200 hertz constitutes a reference signal intended to synchronize a device 430 dividing by 10 and the function of which is to produce from the signal F5 furnished by the local oscillator 80 the signal F4 which is applied to the mixer 60. The signal F5 is also received by the programmable counter 290 whose rate of division is adjusted by the circuit 270 so as to produce a control signal F2 for the purpose of aligning the receiver successively on the various RANA frequencies transmitted in the range of from 285 to 420 kilohertz.

Concerning the operation of the receiver just described by way of example, the latter has been described in detail at the beginning of the present specification. The radio signals received are converted into a series of low frequency signals, each of which constitutes a harmonic or a multiple of the frequency in the interval between adjacent radio signals by an appropriate transposition by means of the mixers 60, 100 and 110 whose control frequencies are selected accordingly. The composite signal formed by the superposition of the low frequency signals thus obtained is sampled by the samplers 150 and 170. The measurement signal SM thus obtained is transmitted to the computing unit, i.e. to the converter 260 and the microprocessor 240. The central unit produces locally a series of lower frequency, which includes the same components of the series which has been sampled and determines the values of the local signals by correlation with the samples. The various operations which the processing unit performs to this end are described in detail in the main patent application. In the case of the present invention, it was important mainly to describe the nature of the control and clocking or timing signals which are necessary for the operation of the acquisition and processing system according to FIG. 2 and of the logic system of FIG. 3. The nature and essential characteristics of these signals appear obviously from the description of the two systems which has just been made.

It should be noted that the values of the frequencies have been given by way of example only. These values may be different and depend of course on the radio signals intended to be received and processed by the receiver of the invention.

What is claimed is:

1. A method for processing a series of signals, particularly radiofrequency signals presenting a same interval of low frequency between adjacent ones of said signals, particularly radiofrequency signals of a radionavigation system such as the RANA system, adapted for determining the location of a station or vehicle carrying a radiofrequency processing receiver, by using the phases of the received signals, wherein the received radio signals are converted into a series of signals of lower frequency presenting said same low frequency interval between adjacent ones of said lower frequency signals, in a way that each of said lower frequency signals constitutes a harmonic or a multiple of said interval frequency between two of said adjacent radiofrequency signals, forming a composite signal by superposing said lower frequency signals constituting harmonics of said interval frequency, said composite signal is then sampled and a series of signals is locally produced in said receiver which includes the same frequency components as the sampled composite signal, a correlation is established between the frequency components of the sampled signal and of the locally produced frequency components and the values, particularly the phases of said local signals are determined by means of said correlation.

2. A method according to claim 1, wherein the series of locally produced frequency components is obtained through a programmed frequency analysis by means of a processing unit such as a computer or a microprocessor.

3. A method according to claim 1, wherein there is predetermined, by an estimation for each signal received, a phase which is checked and adapted by taking into account the values of the samples so as to cause the estimated phase to follow up the phase of the corresponding received signal, this estimated follow-up phase being directly usable for radiolocation.

4. A method according to claim 1, wherein the series of signals produced in the receiver station is expressed in the form of a trigonometric series and the amplitude coefficients of each component of a series is determined according to a development of the Fourier series, wherein the integrals are replaced by Finite sums which are cumulated.

5. A method according to claim 4, wherein the measurement of the individual amplitude is used to obtain indications relating to the quality of the processed signals.

6. Receiver for processing a series of signals, particularly radiofrequency signals in a radionavigation system such as the RANA system, wherein adjacent ones of said radiofrequency signals are separated by a same interval of low frequency, and for establishing from said received radiofrequency signals the location of the vehicle or station carrying said receiver by means of the phases of the received signals, said receiver comprising a system for the acquisition and processing of the received signals comprising a mixer for transposing the series of radiofrequency signals to a series of lower frequency signals in a way that these lower frequency signals constitute harmonics or multiples of said interval frequency separating two of said adjacent radiofrequency signals, a filter mounted downstream of the mixer and adapted to allow the passage of the composite signal formed by the superposition of said lower frequency signals at the output of the mixer, and a sampler adapted to sample the filtered composite signal at a predetermined frequency $f_e$ and a logic system adapted to produce by a frequency analysis operation a series of signals including the same frequency components as said composite signals and to establish the phases of the frequency components produced in the receiver by correlating these components with the samples obtained by the sampler.

7. A receiver according to claim 6 wherein said logic system includes at least one processing unit such as a computer or a microprocessor adapted to ensure the co-operation and the synchronous operation of the devices constituting the acquisition and processing system and the said logic system.

8. A receiver according to claim 7 further comprising an analog-to-digital converter mounted between said sampler and said processing unit.

9. A receiver according to claim 7 further comprising an operational amplifier mounted as a voltage storage provided downstream of said sampler.

10. A receiver according to claim 6, wherein said acquisition and processing system further comprises a series circuit of amplifying means and mixing means, the amplifying means including a high frequency amplifier tuned under the action of an automatic frequency-control voltage T1 supplied by the logic system, and the mixing means being controlled by signals F4,F6,F7 produced by the logic system.

11. A receiver according to claim 6, wherein said acquisition and processing system further comprises a first series circuit of a narrow-band filtre and of a sampler and a second series circuit of a wide-band filtre and second sampler, the two circuits being mounted in parallel downstream of the mixing device.

12. A receiver according to claim 6 further comprising a pilot oscillator of nominal frequency provided with means such as a potentiometer allowing a coarse control of the central frequency and means ensuring a fine control by a control signal F11 from the logic system, the pilot signal F10 of the oscillator being applied to the processing unit of the logic system.

13. A receiver according to claim 12 wherein said processing unit includes an internal frequency-dividing counter adapted to produce from the pilot signal F10 an output signal F12 allowing the production by frequency division of reference signals F6,F1,F14,F15=F16,F17 necessary for the clocking of the filtering and acquisition operations.

14. A receiver according to claim 13 wherein said processing unit is connected by a bidirectional data bus to an analog-to-digital converter from which it receives the signals for measuring the phases and the amplitude SM of the signals received by the receiver and to a circuit adapted to ensure the transfer of the programmed data of the signals received and for the production of a voltage T2 for automatic control of the gain of the amplifying means, and of the signal F11 for the control of the pilot oscillator, the circuit receiving also the interruption signals clocking the programme of the receiver.

15. A receiver according to claim 14, wherein said transfer and control circuit is connected by a bus to a programmable counter of which it adjusts the division rate so as to create the frequency necessary for aligning the receiver successively on the various signals received.

16. A receiver according to claim 15 wherein the processing unit is connected to an address coder for the usual addressing of a programme storage device, of a data storage device, of a keyboard and display device, of a digital output device, of said analog-to-digital converter and of said transfer and control circuit.

17. A receiver according to claim 6, wherein said logic system is adapted to establish the amplitudes of the frequency components.

* * * * *